(12) United States Patent
Paranjpe

(10) Patent No.: US 6,391,754 B1
(45) Date of Patent: May 21, 2002

(54) METHOD OF MAKING AN INTEGRATED CIRCUIT INTERCONNECT

(75) Inventor: Ajit P. Paranjpe, Sunnyvale, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/722,904

(22) Filed: Sep. 27, 1996

(51) Int. Cl.[7] .......................................... H01L 21/3205
(52) U.S. Cl. ...................... 438/592; 438/620; 438/652; 438/658; 438/659; 438/660; 438/661; 438/927
(58) Field of Search .................... 437/35, 189; 438/592, 438/652, 660, 927, 658, 659, 661, 620

(56) References Cited

U.S. PATENT DOCUMENTS

| | | | |
|---|---|---|---|
| 3,682,729 A | 8/1972 | Gukelberger, Jr. et al. ... 156/13 |
| 3,887,994 A | 6/1975 | Ku et al. ...................... 29/571 |
| 4,161,470 A | 7/1979 | Calundann |
| 4,351,918 A | 9/1982 | Charbonneau et al. |
| 4,473,682 A | 9/1984 | Calundann et al. |
| 4,482,394 A | * 11/1984 | Heinecke ..................... 438/659 |
| 4,539,386 A | 9/1985 | Yoon |
| 4,626,371 A | 12/1986 | Ikenaga |
| 4,680,584 A | * 7/1987 | Ho et al. .................. 29/576 B |
| 4,720,424 A | 1/1988 | Eickman et al. |
| 4,742,014 A | * 5/1988 | Hooper et al. .............. 437/192 |
| 4,746,694 A | 5/1988 | Charbonneau et al. |
| 4,920,197 A | 4/1990 | Hayashi et al. |
| 4,942,138 A | * 7/1990 | Miki ............................ 437/35 |
| 4,987,099 A | * 1/1991 | Flanner ....................... 437/192 |
| 5,047,359 A | * 9/1991 | Nagatomo .................... 437/35 |
| 5,071,518 A | * 12/1991 | Pan ............................ 205/122 |
| 5,118,636 A | * 6/1992 | Hosaka ........................ 437/35 |
| 5,130,274 A | * 7/1992 | Harper et al. ............... 437/195 |
| 5,156,985 A | * 10/1992 | Yamada et al. ............... 437/35 |
| 5,158,901 A | * 10/1992 | Kosa et al. ................... 437/35 |
| 5,236,866 A | * 8/1993 | Yasue ........................... 437/35 |
| 5,312,774 A | * 5/1994 | Nakamura et al. .......... 437/192 |
| 5,391,517 A | * 2/1995 | Gelatos et al. .............. 437/190 |
| 5,399,527 A | * 3/1995 | Tabara ........................ 438/659 |
| 5,409,848 A | * 4/1995 | Han et al. .................... 437/35 |
| 5,426,063 A | * 6/1995 | Kaneko et al. ............... 437/35 |
| 5,439,835 A | * 8/1995 | Gonzalez ..................... 437/35 |
| 5,459,086 A | * 10/1995 | Yang ........................... 437/35 |
| 5,488,004 A | * 1/1996 | Yang ............................ 437/35 |
| 5,595,935 A | * 1/1997 | Chan et al. ................. 438/659 |
| 5,670,420 A | * 9/1997 | Choi ............................ 438/659 |

FOREIGN PATENT DOCUMENTS

| | | |
|---|---|---|
| GB | 2 165 692 A | 4/1986 |
| JP | 63-36633 | 7/1988 |
| JP | 63210309 | 2/1990 |

* cited by examiner

*Primary Examiner*—John F. Niebling
*Assistant Examiner*—Lynne A. Gurley
(74) *Attorney, Agent, or Firm*—Carlton H. Hoel; Wade James Brady, III; Frederick J. Telecky, Jr.

(57) ABSTRACT

A method of encapsulating metal lines (130, 132, 134, 136, 138) by implantation of dopants to form surface regions (131, 133, 135, 137, 139) after the metal lines have been fabricated. The surface regions may act as passivation layers and electromigration inhibitors and so forth.

2 Claims, 3 Drawing Sheets

METHOD OF MAKING AN INTEGRATED CIRCUIT INTERCONNECT

BACKGROUND OF THE INVENTION

The invention relates. to semiconductor devices, and, more particularly, to integrated circuit interconnects and methods of fabrication.

Integrated circuits typically include field effect transistors with source/drains formed in a silicon substrate and insulated gates on the substrate together with multiple overlying metal (or polysilicon) interconnects formed in levels. An insulating layer lies between the gates/sources/drains and the interconnects formed from the first metal level (premetal dielectric) and also between successive metal levels (intermetal-level dielectric). Vertical vias in the insulating layers filled with metal (or polysilicon) provide connections between interconnects formed in adjacent metal levels and also between the gate/source/drain and the first metal level interconnects.

Typically the metal interconnects are made of aluminum due to its high conductivity and ease of fabrication. However, poor electromigration and stress voiding characteristics have driven the need to improve the reliability of aluminum interconnects. Alloying, dopant precipitation and intermetallic reaction layer formation affect electromigration, stress-migration robustness and mechanical properties of aluminum films. The simplest approach is to dope the aluminum with small amounts (0.5–4% by weight) of copper. Alloys with high copper content are difficult to etch and also have a tendency for whisker formation depending on the nature of the intermetallic precipitates that are formed. Excessive copper leads to etch residues and an increased tendency for metallic corrosion. These typically constrain the copper doping to below 2%.

Reliability of aluminum interconnects is improved by sandwiching the aluminum between other materials such as TiN and Ti. TiN reduces the tendency for hillock/void formation, serves as an anti-reflection coating to ease patterning, provides a current shunting path if voids are indeed formed, improves the texture of the aluminum, prevents stress migration at vias, and acts as a barrier to prevent interaction between the aluminum and other materials in the device structure. Titanium improves the texture of the aluminum and reacts with aluminum to form an intermetallic with improved electromigration characteristics. Preferred crystallographic orientation has long been recognized to playt an important role in interconnect reliability (i.e., thermal hillocks, grain collapse, stress voiding, and electromigration). A strong (111) texture improves electromigration lifetime. Deposition conditions and the presence of underlayers have the greatest influence on texture. As linewidths are scaled to below 0.5 $\mu$m, the percentage of Al surface area that is encapsulated with Ti and TiN gets smaller, and the effectiveness of this approach diminishes. For a 0.35 $\mu$m wide line, only the top and bottom surfaces can be protected with Ti/TiN layers, while the sides (0.6 $\mu$m tall) remain bare. Metal stacks are also harder to etch since a multiple step etch. with high selectivity to the underlayers is necessary.

Deposition conditions can also improve interconnect reliability. Higher deposition temperatures incrase grain size (electromigration performance is typically superior for larger grain sizes), but contact/via reliability can degrade. for high thermal budget processes. Thus there is a need for a method that provides complete Al encapsulation. One approach treats aluminum lines with a wet chemical bath of $H_2O_2$ to oxidize the surfaces for passivation.

In general, addition of dopants (e.g., arsenic, antimony, metals, oxygen, nitrogen, and fluorine) into aluminum can modify electrical and mechanical properties. For example, arsenic improves elecrotromigration, and fluorine reduces stress-induced hillock formation.

SUMMARY OF THE INVENTION

The present invention provides doping of interconnect surface regions to encapsulate the interconnect and improve properties such as electromigration and corrosion resistance and also serves as a barrier. In particular, preferred embodiments include implants of dopants into the sidewalls of clad or unclad aluminum interconnects and dopant implants into sidewalls of trenches formed in dielectrics followed by diffusion into copper interconnects filling the trenches.

BRIEF DESCRIPTION OF THE DRAWINGS

The drawings are schematic for clarity.

DESCRIPTION OF THE PREFERRED EMBODIMENTS

First Preferred Embodiment

Figure 1A:
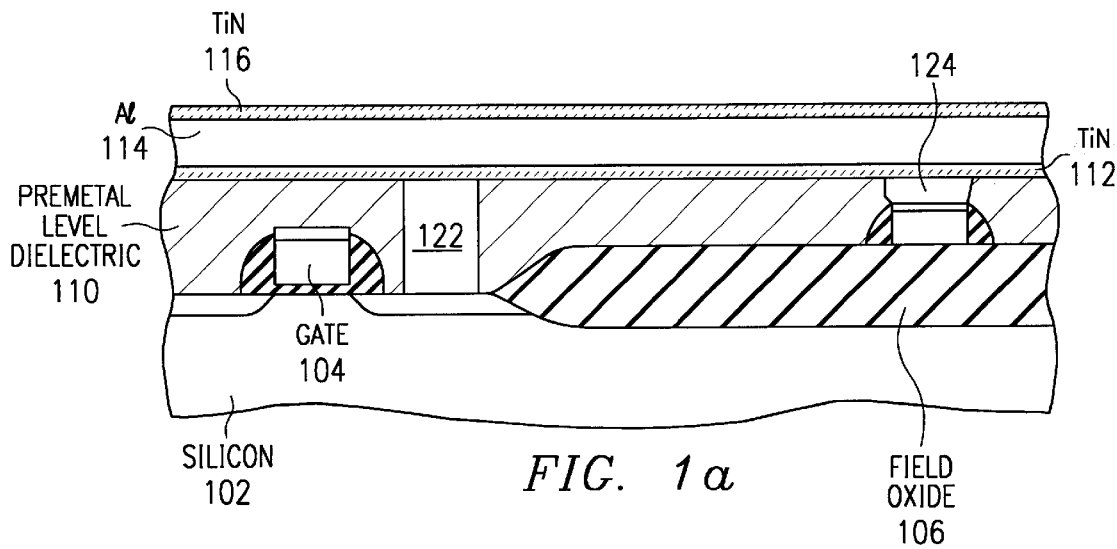
FIGS. 1a–c illustrate in cross sectional elevation views the steps of a first preferred embodiment and method.
Figure 1B:
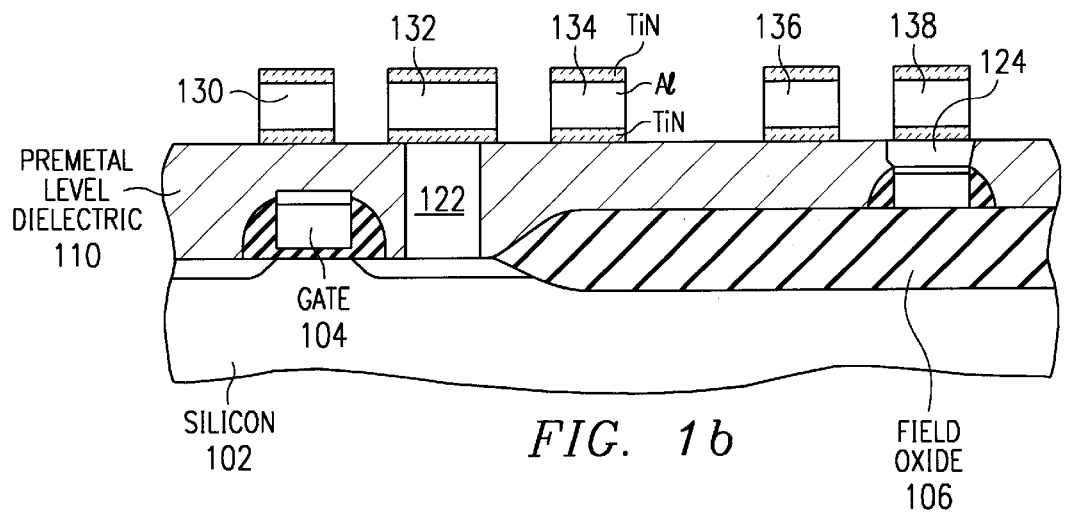
Figure 1C:
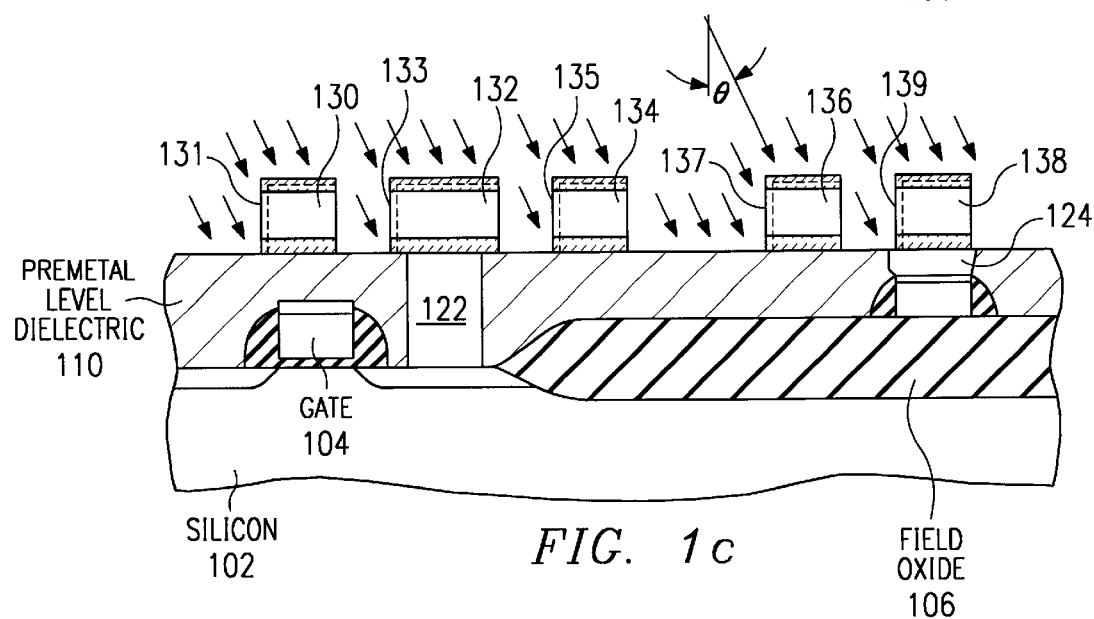

FIG. 1a–c illustrate in cross sectional elevation view the steps of a first preferred embodiment method of metal interconnect formation during integrated circuit fabrication. In particular, start with the partially fabricated circuit of FIG. 1a which includes polysilicon gate 104 and field oxide 106 on silicon substrate 102 and overlying premetal level dielectric (PMD) 110 (which may be silicon dioxide). Metal (e.g., tungsten) filled vias 122–124 extending through PMD 110 and blanket clad aluminum metal layer including TiN 112, aluminum 114, and TiN 116 covers PMD 110. TiN 112 and 116 may each be about 50 nm thick and aluminum 114 about 0.6 $\mu$m thick.

Next, photolithographically define interconnect patterns on the clad aluminum layer and anisotropically etch the clad aluminum to form interconnects 130–138. Clean up after the anisotropic etch; the etch may be a chlorine based plasma etch. The interconnects may be 0.35–0.5 $\mu$m wide and 0.7 $\mu$m high with only 0.35–0.5 $\mu$m spacing between interconnects 130–132–134 and between interconnects 136–138. Thus the area of exposed aluminum exceeds the area of clad aluminum at the surfaces of the interconnects, and the cladding effectively covers less than half of the aluminum surface.

Then modify the unclad vertical aluminum sidewall surface by ion implantation. See FIG. 1c illustrating dopant implantation at angle θ tilted from the normal to the substrate; the implants form modified surface regions 131, 133, 135, 137, and 139 in the vertical sidewalls of the aluminum interconnects 130, 132, 134, 136, and 138, respectively. Because interconnects tend to be laid out generally parallel to an edge of the integrated circuit's rectangular die, four angled implants with one implant angled in each of the four directions parallel the die edges suffice for good sidewall coverage. FIG. 1c shows just one of the four implants; a second implant would have ions directed generally from upper righthand to lower lefthand in FIG. 1c; and the other two implants would be directed at angles into and out of the plane of the figure. Alternatively, the wafer may be rotated to implant all exposed surfaces.

The implant dose for each of the four angled implants will be on the order of $10^{15}$ atoms/cm$^2$ at a low energy such as 5–40 KeV. Dopants such as As, Sb, Si, Ti, O, N, F, . . . will have projected ranges of roughly 1–30 nm with the lighter ions having greater projected ranges for equal energies. This yields a surface region of doping concentration roughly $4 \times 10^{20}$/cm$^3$, or about 1% atomic. Such a concentration suffices to significantly modify the electrical and mechanical characteristics of aluminum and forms an encapsulation for the aluminum interconnect but has little effect on dielectric 110, cladding on the aluminum, or the net resistance of the interconnect. Further, the top cladding on the aluminum could be omitted and the implanted dopants also provide the aluminum top surface encapsulation.

A thermal anneal (e.g., 200–450° C.) may be necessary after implantation to induce chemical reaction between the dopant and the metal in the modified surface layer and form the encapsulation of the interconnect. In particular, implanting As into aluminum yields a surface aluminum arsenide type region which helps suppress electromigration.

Similarly, implanting oxygen or nitrogen into aluminum gives a surface region of aluminum oxides or nitrides which passivate the surface.

Implantations of two or more types of dopants yield more complex modified surface layers which may provide more involved characteristics.

Figure 2A:
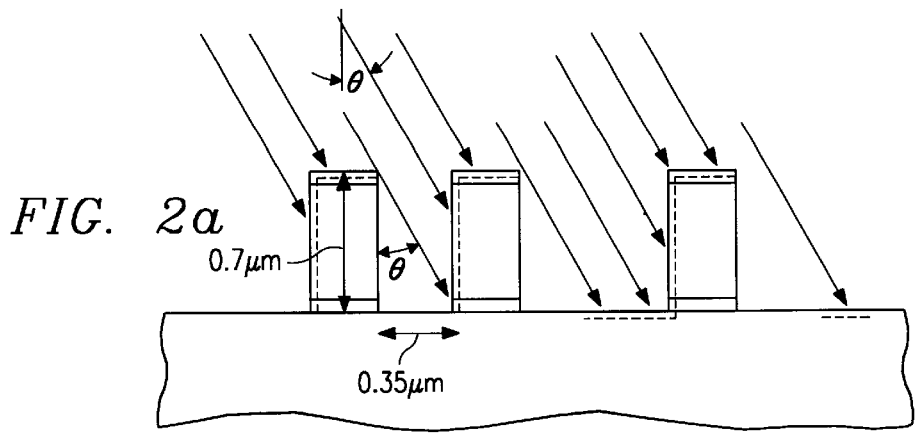
FIGS. 2a–b show implant angles.
Figure 2B:
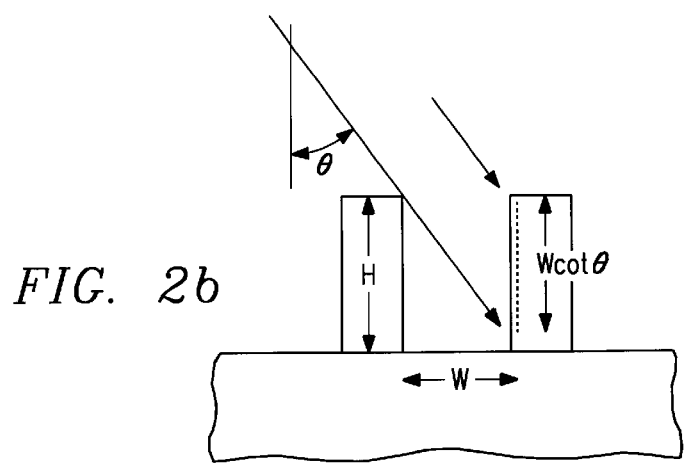

FIGS. 2a–b show the determination of the implant angle: (1) first, increasing the tilt angle θ increases the fraction of the implant lodging in (unshadowed) vertical sidewalls instead of horizontal surfaces, thus the greater the tilt angle the better the implant efficacy; and (2) most (e.g, at least 75%) of the exposed aluminum sidewall area should be implanted to achieve the desired effects, but this imposes an upper limit on the implant angle tilt due to shadowing by adjacent interconnects. For example, with a spacing between interconnects of about 0.35 µm and interconnects of height about 0.7 µm, the tilt angle for the implant should be about arctan(0.35/0.7) (about 26.5°) for full sidewall coverage as illustrated in FIG. 2a. If only a portion of the sidewall need be implanted, then the angle is determined from the fraction of the sidewall implanted: the fraction equals Wcotθ/H with W the spacing between the sidewall and the adjacent shadowing structure of height H; see FIG. 2b. These larger angle implants can be performed in special large angle ion implanters.

Second Preferred Embodiment

Figure 3A:
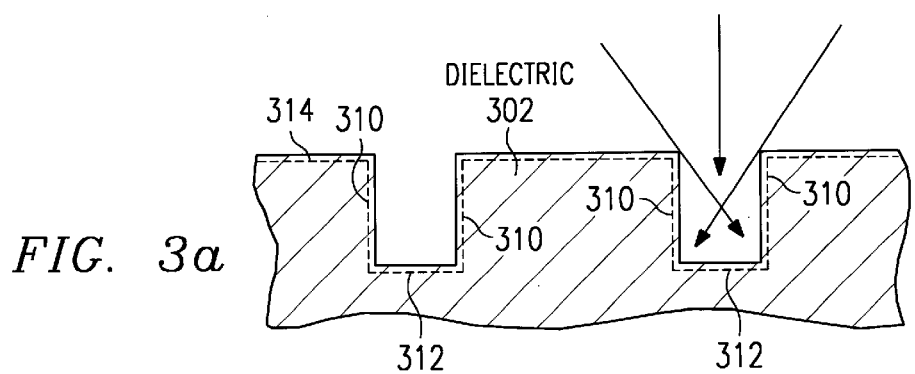
FIGS. 3a–b illustrate a second preferred embodiment.
Figure 3B:
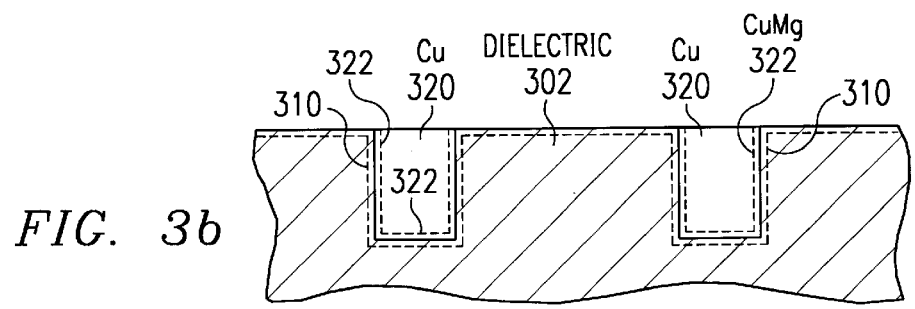

FIGS. 3a–b illustrate a second preferred embodiment method of tilted angle implant to affect metal surface properties, although the ions are originally implanted into the dielectric and then migrate into the metal after the metal deposition and anneal. In particular, form grooves of depth 0.7 µm and width 0.35 µm in dielectric 302, and then implant Mg ions of dose $10^5$ atoms/cm$^2$ at a low energy such as 5–20 KeV in each of the four tilt dirctions plus also implant with zero tilt to cover the bottom of the grooves. Again, the implant tilt angle for this height-to-width ratio is about 26.5; the illustration of implant angles in FIGS. 2a–b still applies.

FIG. 3a shows sidewall implanted regions 310, bottom implanted regions 312, and top surface implanted regions 314. Note that the angled implants also contribute to the surface regions 314 and to the bottom regions 312 if the groove is along the plane of the tilt direction. Thus very roughly the surface regions 314 have five times the dose of the sidewall regions 310, and the bottom regions 312 have about three times the dose of the sidewall regions 310. In fact, the zero tilt implant may be omitted if the angled implant sufficiently covers the groove bottoms.

After the Mg implant, fill the grooves with copper 320 by a blanket copper deposition followed by etchback. Then anneal at 200–350° C. to diffuse the Mg out of dielectric 302 into surface regions 322 of copper 320 to form Cu:Mg which encapsulates the copper surface; see FIG. 3b. Dopants tend to segregate at interfaces; this phenomenom aids dopant diffusion and subsequent reaction at the dielectric-metal interface. The encapsulation serves as a diffusion, oxidation and corrosion barrier for the copper interconnects.

Multiple Metal Layers Preferred Embodiment

Figure 4A:
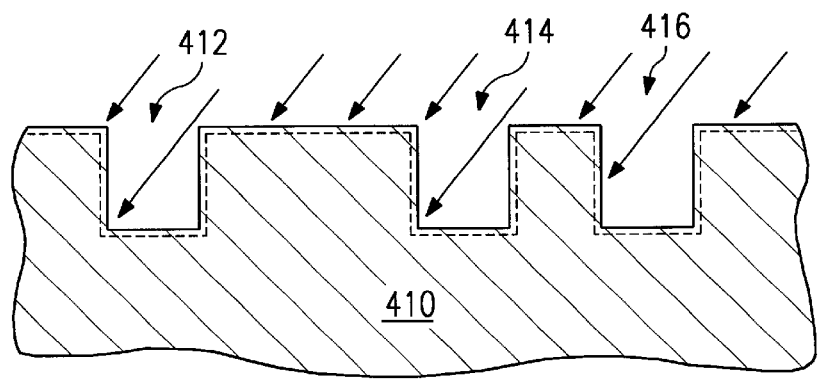
FIGS. 4a–c show repeated use of the preferred embodiments.
Figure 4B:
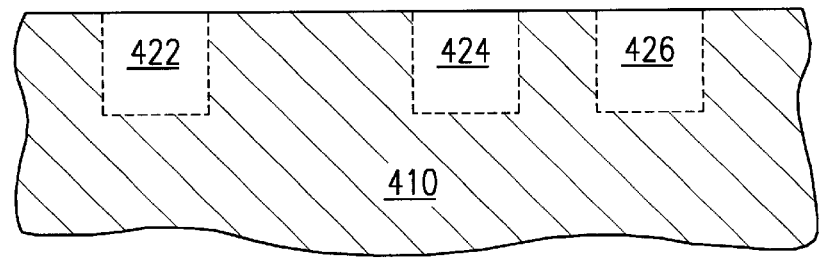
Figure 4C:
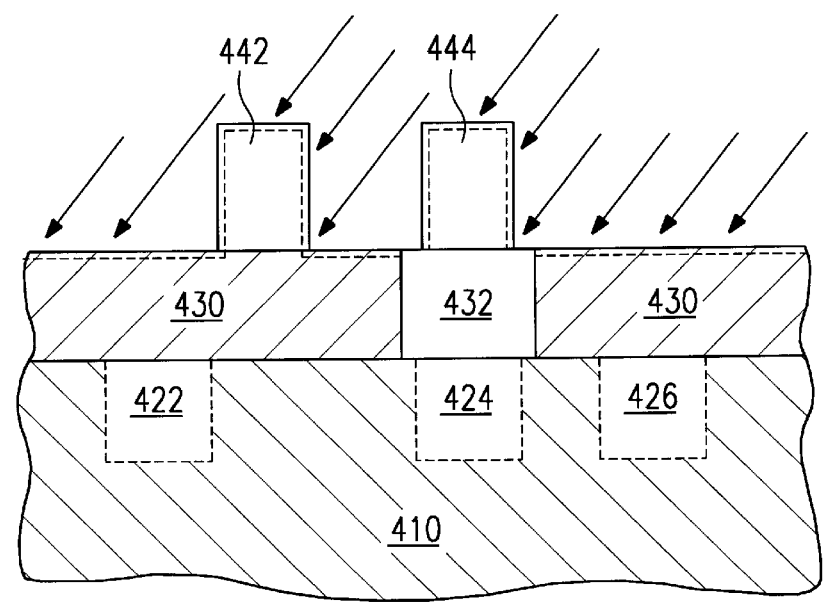

FIGS. 4a–c show two successive applications of the preferred embodiments for encapsulation of two successive metal levels. In particular, FIG. 4a shows implanting dopants into the surfaces of dielectric 410 which contains trenches 412–416. Next, a blanket metal deposition followed by chemical mechanical polishing (CMP) fills the trenches with metal and planarizes the surface to yield interconnects 422–426 in trenches 412–416 as illustrated in FIG. 4b. An anneal (temperature depending upon the metal used) diffuses the dopants from the dielectric to react with and encapsulate metal interconnects 422–426. Then deposit planar dielectric 430 and form metal-filled vias 432, deposit a metal layer and pattern it to form interconnects 442–446. Lastly, implant dopants to encapsulate interconnects 442–446 as shown in FIG. 4c.

Modifications

Modifications of the preferred embodiments feature of surface region modification after interconnect formation to encapsulate the interconnect include:

Use of different interconnect metals and dopants; application to structures other than interconnects; implantation of the surface region dopants through a thin layer deposited on the metal surface; various implant doses such as from low doses about $10^4$/cm$^2$ to high doses about $10^6$/cm$^2$; multiple implants for multiple dopants; different interconnect. sizes and aspect ratios; and so forth.

What is claimed is:

1. A method of encapsulating clad metal structures in an integrated circuit comprising the steps of:

(a) providing a partially formed integrated circuit with a clad metal structure including a first metal structure and a cladding metal on a top horizontal surface of the first metal; and (b) implanting dopants into exposed first metal vertical sidewalls of said clad metal structure to form vertical surface regions of first metal-dopant mixtures.

2. The method of claim 1, further comprising the step of:

(a) after said implanting dopants, annealing said clad metal structure with said implanted dopants.

* * * * *

UNITED STATES PATENT AND TRADEMARK OFFICE
CERTIFICATE OF CORRECTION

PATENT NO.     : 6,391,754 B1                                                        Page 1 of 1
DATED          : May 21,
INVENTOR(S)    : Ajit P. Paranjpe It is certified that error appears in the above-identified patent and that said Letters Patent is hereby corrected as shown below:

<u>Title page,</u>
Item [22], Filed: "Sep. 27, 1996" insert: -- Related U.S. Application Data Provisional application No. 60/004,406, Sept 27, 1995 --.

<u>Column 1,</u>
After line 3, insert: -- This application claims priority under 35 USC 119(e)(1) of provisional application number 60/004,406, filed 09/27/95. --

Signed and Sealed this

Eighth Day of October, 2002

Attest:

Attesting Officer

JAMES E. ROGAN
*Director of the United States Patent and Trademark Office*